US009188514B1

(12) United States Patent
Taylor

(10) Patent No.: US 9,188,514 B1
(45) Date of Patent: Nov. 17, 2015

(54) SYSTEM AND METHOD FOR PRODUCING A SAMPLE HAVING A MONOTONIC DOPING GRADIENT OF A DIFFUSIVE CONSTITUENT OR INTERSTITIAL ATOM OR MOLECULE

(71) Applicant: The United States of America as represented by the Secretary of the Navy, Washington, DC (US)

(72) Inventor: Benjamin J. Taylor, San Diego, CA (US)

(73) Assignee: THE UNITED STATES OF AMERICA AS REPRESENTED BY THE SECRETARY OF THE NAVY, Washington, DC (US)

( * ) Notice: Subject to any disclaimer, the term of this patent is extended or adjusted under 35 U.S.C. 154(b) by 184 days.

(21) Appl. No.: 13/901,351

(22) Filed: May 23, 2013

(51) Int. Cl.
*G01N 1/44* (2006.01)
*G01N 1/22* (2006.01)

(52) U.S. Cl.
CPC .......................................... *G01N 1/22* (2013.01)

(58) Field of Classification Search
CPC .................................. G01N 1/44; G01N 1/22
USPC .................................................. 436/2, 4, 181
See application file for complete search history.

(56) References Cited

U.S. PATENT DOCUMENTS

| 3,982,885 | A | * | 9/1976 | Hoger et al. ..................... 432/24 |
| 4,718,949 | A | * | 1/1988 | Takase et al. .................. 148/672 |
| 4,820,358 | A | * | 4/1989 | Chang ........................... 148/567 |
| 6,051,483 | A | * | 4/2000 | Lee et al. ....................... 438/530 |
| 6,274,449 | B1 | * | 8/2001 | Vasanth et al. ................ 438/305 |
| 7,170,001 | B2 | * | 1/2007 | Gee et al. ....................... 136/256 |
| 8,088,675 | B2 | * | 1/2012 | Rana et al. ..................... 438/482 |
| 2001/0054457 | A1 | * | 12/2001 | Segal et al. .................... 148/438 |
| 2002/0142349 | A1 | * | 10/2002 | Tennstedt et al. .............. 435/7.1 |
| 2004/0261839 | A1 | * | 12/2004 | Gee et al. ....................... 136/256 |
| 2006/0240058 | A1 | * | 10/2006 | Galis et al. .................... 424/422 |
| 2008/0149178 | A1 | * | 6/2008 | Reyes-Reyes et al. ........ 136/263 |
| 2010/0240172 | A1 | * | 9/2010 | Rana et al. ..................... 438/96 |

OTHER PUBLICATIONS

Hanak, J. J., Journal of Materials Science 1970, 5, 964-971.*
Hanak, J. J., Journal of Vacuum Science and Technology 1971, 8, 172-175.*
Ohashi, S. et al, Review of Scientific Instruments 1999, 70, 178-183.*
Koida, T. et al, Applied Physics Letters 2002, 80, 565-567.*
Tsukazaki, A. et al, Applied Physics Letters 2002, 81, 235-237.*
Meredith, J. C. et al, Journal of Biomedical Materials Research 2003, 66A, 483-490.*
Ohtani, M. et al, Review of Scientific Instruments 2005, 76, 062218, 7 pages.*

(Continued)

*Primary Examiner* — Arlen Soderquist
(74) *Attorney, Agent, or Firm* — Spawar Systems Center Pacific; Kyle Eppele; Ryan J. Friedl

(57) ABSTRACT

A sample of a chemical compound is contained within a pressure controlled atmospheric chamber that is set to a predetermined atmospheric pressure. The sample includes a parent material and one or more diffusive atomic or molecular constituents or interstitials. The sample is in thermal contact with a heat source having a first temperature and a heat sink having a second temperature. The sample is annealed until an equilibrium gradient distribution of the diffusive atomic or molecular constituents or interstitials occurs along the sample.

15 Claims, 4 Drawing Sheets

(56) References Cited

OTHER PUBLICATIONS

Okazaki, S. et al, Applied Surface Science 2006, 252, 2615-2621.*
Zhao, X. R. et al, Applied Surface Science 2006, 252, 2628-2633.*
Thienhaus, S. et al, Materials Research Society Symposium Proceedings 2006, 894, 0894-LL01-04, 7 pages.*
Barber, Z. H. et al, Materials Science and Technology 2008, 24, 757-770.*
Ding, Y. et al, Macromolecules 2010, 43, 8191-8201.*
D.C. York, A. Chambers, and A.D. Chew, "Thermal transpiration of helium and nitrogen in 50-Im bore silica capillaries", Vacuum, v. 59, pp. 910-918 (2000).
Shidong Li and Cemal Basaran, "A computational damage mechanics model for thermomigration", Mechanics of Materials, v. 41, pp. 271-278 (2009).
Moran Jerabek-Willemsen, Chistoph J. Wienken, Dieter Braun, Philipp Baaske, and Stefan Duhr, "Molecular Interaction Studies Using Microscale Thermophoresis", ASSAY and Drug Development Technologies, p. 342-53, Aug. 2011.
R.V. Hesketh, "A Heavy Isotope in a Solid Drifts Down a Thermal Energy Gradient", Journal de Physique, 37(3), pp. 183 (1976).
S. J. Rothman, J. L. Routbort, U. Welp, and J. E. Baker, "Anisotropy of oxygen tracer diffusion in single-crystal $YBa_2Cu_3O_7$", Phys. Rev. B 44, pp. 2326 (1991).
I. Ohkubo, H. M. Christen, Sergei V. Kalinin, G. E. Jellison Jr., C. M. Rouleau, and D. H. Lowndes, "High-throughput growth temperature optimization of ferroelectric Sr x Ba 1-x Nb 2 O 6 epitaxial thin films using a temperature gradient method", Appl. Phys. Lett. 84, pp. 1350 (2004).
T. B. Lindemer, J. F. Hunley, J. E. Gates, A. L. Sutton Jr., J. Brynestad, C. R. Hubbard, and P. K. Gallagher, "Experimental and Thermodynamic Study of Nonstoichiometry in (YBaCu,O,-x)", J. Am. Ceram. Soc., v. 72, pp. 1775-1788 (1989).
S. J. Hagen, Z. Z. Wang, and N. P. Ong, "Anisotropy of the thermal conductivity of $YBa_2Cu_3O_7$-y," Phys. Rev. B 40, 9389 (1989).
A. Bock, "Laser heating of $YBa_2Cu_3O_7$ films in Raman experiments," Phys. Rev. B 51, 15506 (1995).
M. Matsukawa, T. Mizukoshi, K. Noto, and Y. Shiohara, "In-plane and out-of-plane thermal conductivity of a large single crystal of $YBa_2Cu_3O_7$-x," Phys. Rev. B 53, R6034 (1996).
A. V. Inyushkin, A. N. Taldenkov, and T. G. Uvarova, "Thermal conductivity of oxygen-deficient $YBa_2Cu_3O_6$-x," Phys. Rev. B 54, 13261 (1996).
T. Ikeda, T. Ando, Y. Taguchi, and Y. Nagasaka, "Size effect of out-of-plane thermal conductivity of epitaxial $YBa_2Cu_3O_7$-δ thin films at room temperature measured by photothermal radiometry," J. Appl. Phys. 113, 183517 (2013).
C. Yu, et al., "Thermal conductivity reduction in oxygen-deficient strontium titanates," Appl. Phys. Lett. 92, 191911 (2008).
UC Berkeley Nano-Energy Lab website, "Thermal Transport in Highly Anisotropic Materials," http://dameslab.berkeley.edu/research.html, Copyright 20133.
Z. Chen, Z. Wei, Y. Chen, and C. Dames, "Anisotropic Debye model for the thermal boundary conductance," Phys. Rev. B 87, 125426 (2013)
P. E. Hopkins, et al., "Influence of anisotropy on thermal boundary conductance at solid interfaces," Phys Rev B 84, 125408 (2011).
R. Schittny, M. Kadic, S. Guenneau, and M. Wegener, "Experiments on Transformation Thermodynamics: Molding the FLow of Heat," Phys. Rev. Lett. 110, 195901 (2013).
M. Kadic, T. Buckmann, R. Schittny, and M. Wegener, "Metamaterials beyond electromagnetism," Rep. Prog. Phys. 76, 126501 (2013).
T. Han, et al., "Manipulating Steady Heat Conduction by Sensushaped Thermal Metamaterials," Sci Rep. 5, 10242 (2015).
F. Chen & D. Y. Lei, "Experimental Realization of Extreme Heat Flux Concentration with Easy-to-Make Thermal Metamaterials ," Sci. Rep. 5, 11552 (2015).
E. M. Dede, T. Nomura, P. Schmalenberg, and J. S. Lee, "Heat flux cloaking, focusing, and reversal in ultra-thin composites considering conduction-convection effects," Appl. Phys. Lett. 103, 063501 (2013).
Z. Gao, et al., "Thermal chemical vapor deposition grown graphene heat spreader for thermal management of hot spots," Carbon 61, 342 (2013).
E. Pop, V. Varshney, and A. K. Roy, "Thermal properties of graphene: Fundamentals and applications," MRS Bulletin 37, 1273 (2012).
B. J. Taylor, et al., "Correlation of structural, magnetic, and electronic transitions of a novel charge-gradient $YBa_2Cu_3O$ V x film," Phys. Rev. B 91, 144511 (2015).

* cited by examiner

SYSTEM AND METHOD FOR PRODUCING A SAMPLE HAVING A MONOTONIC DOPING GRADIENT OF A DIFFUSIVE CONSTITUENT OR INTERSTITIAL ATOM OR MOLECULE

FEDERALLY-SPONSORED RESEARCH AND DEVELOPMENT

The System and Method for Producing a Sample Having a Monotonic Doping Gradient of a Diffusive Constituent or Interstitial Atom or Molecule is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; email ssc_pac_T2@navy.mil; reference Navy Case Number 102010.

BACKGROUND

Conventionally prepared samples are annealed at a carefully controlled constant temperature and oxygen pressure. The physical properties of these conventional samples are then investigated through various measurements on a series of samples prepared under varied annealing conditions so as to have discretely varied oxygen content. It would be advantageous to have a system and method to prepare such a sample so that the oxygen content is controllably varied physically within the same sample. With such a sample, it would be possible to perform electronic transport measurements over micro- to nano-scale regions having significantly smaller differences in oxygen content, leading to a greatly improved characterization of the evolving physical properties under study.

DETAILED DESCRIPTION OF SOME EMBODIMENTS

Figure 1:
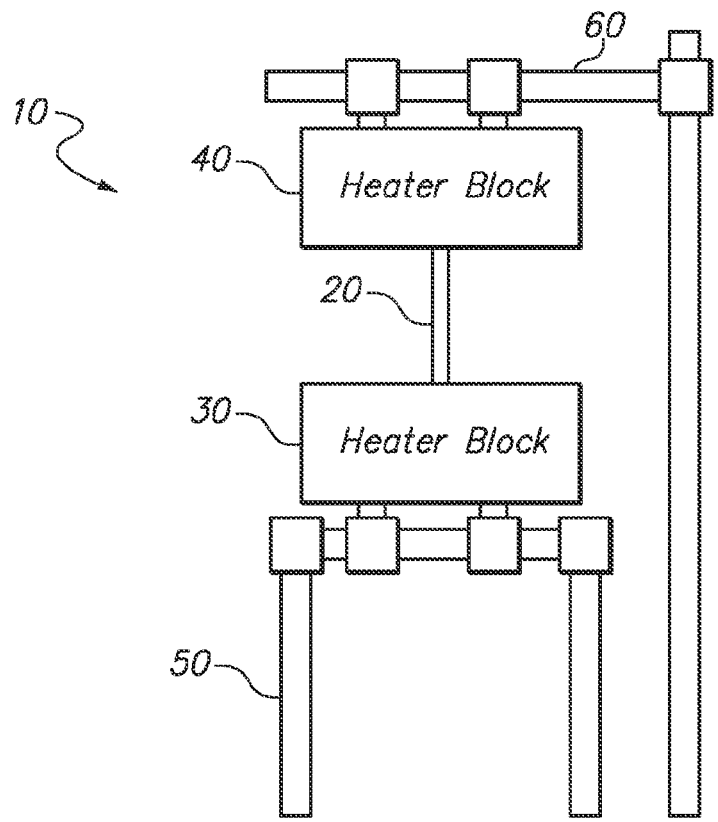
FIG. 1 shows a front view of a schematic diagram of an embodiment of a system employing a sample between two heat sources, in accordance with the System and Method for Producing a Sample Having a Monotonic Doping Gradient of a Diffusive Constituent or Interstitial Atom or Molecule.

The embodiments of the system and method described herein can be utilized with any sample material that has as a step in the preparation process an annealing period in either a reactive or inert gas wherein the final composition of the material is determined by the temperature of the sample and the pressure of the gas.

The embodiments of the system and method may be used for various purposes including producing a high temperature cuprate superconductor, $YBa_2Cu_3O_x$, that has a continuously varying oxygen content across the sample ($6 \leq x \leq 7$). The oxygen content of this and similar materials is determined by the temperature of the sample and the pressure of the oxygen atmosphere during the anneal process.

The embodiments of the system and method described herein may be used, for example, for annealing of single crystal or film samples in controlled atmospheric conditions while simultaneously applying a thermal gradient across a length of the sample. As an example, the system may be used for production of samples having a continuous physical variation in oxygen content along a length and width of the sample. The oxygen content of these materials is determined by the annealing conditions of temperature and atmospheric (oxygen, argon, etc.) pressure. The compositional oxygen gradient may be achieved by positioning the sample between thermal stages (heaters and/or heat sinks) that are inside of a pressure controlled atmospheric chamber, such as a vacuum chamber. The pressure of the gas in the chamber may then be set and held fixed at a given or to be determined value. The stages may then be set at temperatures above and below the characteristic thermal activation temperature at which certain atomic constituents of the material will be able to diffusively move in or out of the parent material.

With the sample mounted between the two thermal stages, the atmospheric gas may be set to a respective low or high pressure. Finally, the sample stages may be set to the low and high temperature set points and the sample is allowed to anneal so that the atmospheric gas will diffuse out of (into) the sample at the high temperature end.

The level of oxygen content in $YBa_2Cu_3O_x$, and similar cuprate based high-Tc superconductors, directly determines the carrier charge density (holes), p, in the Cu—O planes, in the system and is correlated with the temperature at which the material becomes superconducting as well as other important observed phenomena. Studies have established that as the hole content is varied the materials undergo various electronic phase transitions wherein typically an observed physical property, such as the electronic effective mass, diverges as the critical doping level is approached.

By using the embodiments of the system and method discussed herein, in addition to greatly enhancing the characterization of the relationship between the evolving physical properties and the carrier charge density, it is possible to carryout novel electronic transport measurements in configurations such that superconducting and non-superconducting electrons must physically transit from one electronic state to another while passing through a region known as a tunnel junction.

Figure 6:
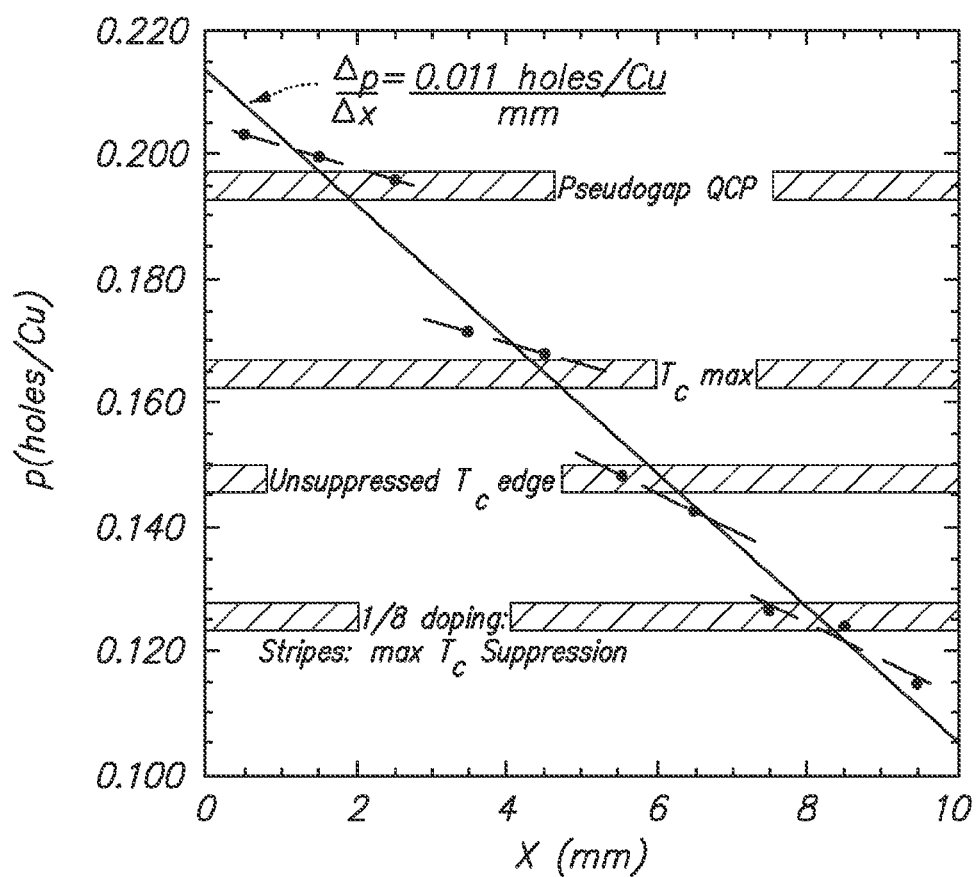
FIG. 6 shows a graph of the hole doping content per Cu site in the Cu—O plane vs. position along the sample length, p vs. x, of a $YBa_2Cu_3O_x$ film annealed using the System and Method for Producing a Sample Having a Monotonic Doping Gradient of a Diffusive Constituent or Interstitial Atom or Molecule.

As an example, the samples produced as a result of the system and method discussed herein may be used to make Josephson junctions with an electrochemical potential across the junction (see FIG. 6). Of particular interest are Josephson junctions wherein the electrons on each side of the junction have distinct electronic ground states. In the case where a Fermi surface reconstruction occurs in the region of the junction, experimental evidence indicates that the effective electronic mass diverges. Such a phenomenon will impact the tunneling properties of the junctions. Another region of interest is the charge (hole) doping level of the putative Quantum Critical Point (QCP) at $p \approx 0.2$. With junctions prepared such that opposing connections lie on each side of the QCP it is conceivable that an electronic transport experiment could directly probe the nature of a QCP via the impact on the fundamental properties of the tunneling electrons.

FIG. 1 shows a front view of a schematic diagram of an embodiment of a system 10 employing a sample between two heat sources, in accordance with the System and Method for Producing a Sample Having a Monotonic Doping Gradient of a Diffusive Constituent or Interstitial Atom or Molecule. System 10 includes a sample 20 in thermal contact with a first heat source 30 and a second heat source 40.

In some embodiments, sample 20 is physically in contact with heat sources 30 and 40. In some embodiments, sample 20 is held in place between heat sources 30 and 40 via an applied pressure. For example, this pressure may be applied manually, with supports 50 and 60 being adjusted and then held fixed via set-screws or a similar locking mechanism. Alternatively, supports 50 and 60 can have their position controlled via a threaded rod, ratchet, hydraulic, or similar type assembly so that the pressure can be controllably applied to sample 20 in a repeatable manner.

Sample 20 is a sample of a chemical compound and may comprise any size or shape. Examples of sample 20 include $YBa_2Cu_3O_x$ and similar oxide compounds, fluorine doped Fe—As superconducting compounds and similar pnictide compounds, pure metal or metallic alloys with diffusive hydrogen, optical materials annealed in a reactive gas, or any such chemical compound that exhibits useful changes in physical properties upon undergoing an annealing process. Sample 20 may be a deposited film or a single or large grain crystalline material. For instance, in the case where sample 20 is a uniformly overdoped ($p \gtrsim 0.20$) cuprate superconductor single crystal or film, the sample may initially be prepared with either a uniform high (maximum) or low (minimum) oxygen content. For example, using YBa2Cu3Ox, the oxygen content, x, can be between 6 or 7, where 6 is low and 7 is high. The low/high criterion is determined by the minimum/maximum amount of oxygen (diffusive molecule) that the parent/host compound can reversibly uptake or expel without undergoing an irreversible chemical breakdown into new stoichiometric compounds.

Heat source 30 is set to a first temperature and heat source 40 is set to a second temperature. The difference in temperatures between heat source 30 and heat source 40 may depend upon various factors such as the composition of the sample material, the desired gradient for the sample material, and the gas and pressure used in the atmospheric chamber. In some embodiments, the first temperature is a temperature above a characteristic thermal activation temperature of the sample at which at least some of the diffusive atomic constituents, such as oxygen, nitrogen, and hydrogen are able to diffusively move in and out of the parent material, such as YBa2Cu3Ox, yttria stabilized zirconia, and tantalum or palladium, respectively, in a gaseous phase, while the second temperature is a temperature below this characteristic thermal activation temperature. Such temperatures are known to those having ordinary skill in the art and are readily available in the literature. As an example, heat sources 30 and 40 may be heater blocks.

In some embodiments, the temperatures of heat sources 30 and 40 may be set and variably controlled using temperature controllers (not shown) connected thereto.

Heat source 30 is secured to a support 50 and heat source 40 is secured to a support 60, such that heat source 40 is positioned directly above and separated from heat source 30. In other embodiments, heat source 40 and heat source 50 may be oriented differently with respect to one another. As an example, supports 50 and 60 may comprise adjustable stainless steel frames. However, other configurations and materials may be used for supports 50 and 60 as would be recognized by one having ordinary skill in the art.

Figure 2:
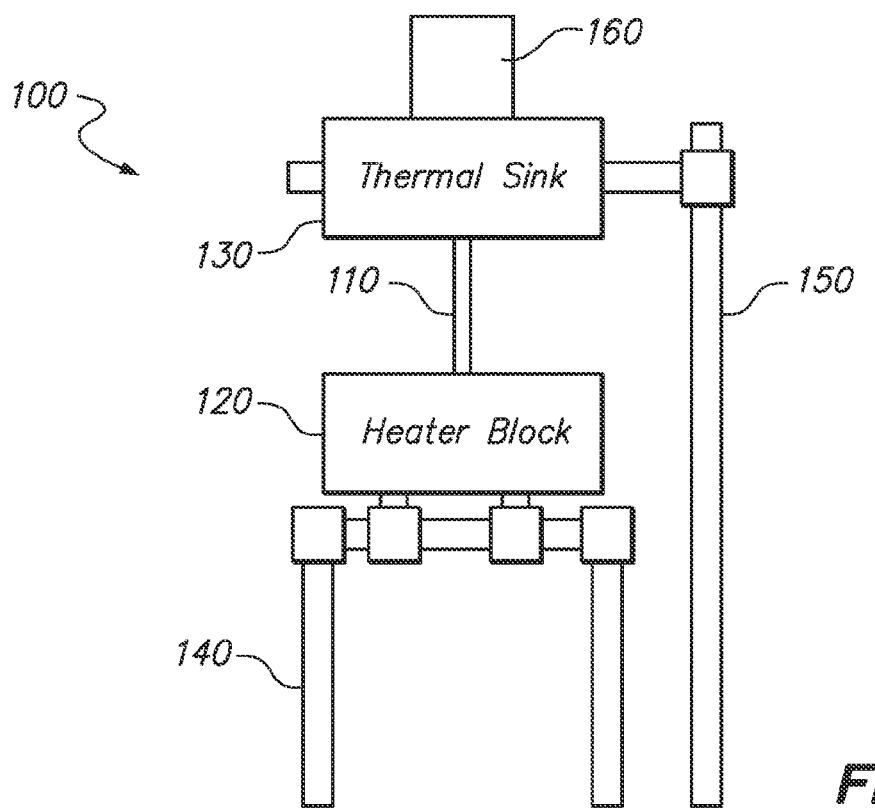
FIG. 2 shows a front view of a schematic diagram of an embodiment of a system employing a sample between a heat source and a heat sink, in accordance with the System and Method for Producing a Sample Having a Monotonic Doping Gradient of a Diffusive Constituent or Interstitial Atom or Molecule.

FIG. 2 shows a front view of a schematic diagram of another embodiment of a system 100 in accordance with the System and Method for Producing a Sample Having a Monotonic Doping Gradient of a Diffusive Constituent or Interstitial Atom or Molecule. System 100 includes a sample 110 in thermal contact with a heat source 120 and a heat sink 130. Sample 110 may be configured the same as sample 20 shown in FIG. 1. As an example, heat source 120 may be a heater block and heat sink 130 may comprise a non-reactive metal such as stainless steel. In some embodiments, sample 110 is physically in contact with heat source 120 and heat sink 130. Heat source 120 is set to a higher temperature than heat sink 130. The temperature of heat source 120 and the temperature of heat sink 130 may be set to a particular temperature and controlled by temperature controllers (not shown) connected thereto.

Heat source 120 is secured to a support 140 and heat sink 130 is secured to a support 150, such that heat sink 130 is positioned directly above and separated from heat source 120. Supports 140 and 150 may be similar to supports 50 and 60 shown in FIG. 1. In other embodiments, heat source 130 and heat sink 140 may be oriented differently with respect to one another. As an example, supports 140 and 150 may comprise adjustable stainless steel frames. However, other configurations and materials may be used for supports 140 and 150 as would be recognized by one having ordinary skill in the art.

In some embodiments, heat sink 130 has a temperature monitor 160, such as a thermocouple, operatively connected thereto. In some embodiments, the thermocouple junction is in direct physical contact with the top edge of the sample material. Temperature monitor 160 serves to monitor the temperature of thermal sink 130 and may comprise any commercially available thermocouple, thermometer, etc. In some embodiments, temperature monitor 160 may be positioned with the supportive ceramic body above thermal sink 130, as shown. In such embodiments, where a thermocouple is used, the thermocouple junction may be in contact with the sample. In embodiments involving a thermocouple, heat sink 130 holds the ceramic section of the thermocouple to keep the thermocouple wires electrically insulated from each other and to keep thermocouple stable at high temperatures. The ceramic section is typically in the shape of a cylinder with two holes along its length. In some embodiments, and with adequate calibration, the thermocouple may be directly in contact with the heat sink at a point away from the sample/sink interface.

Figure 3:
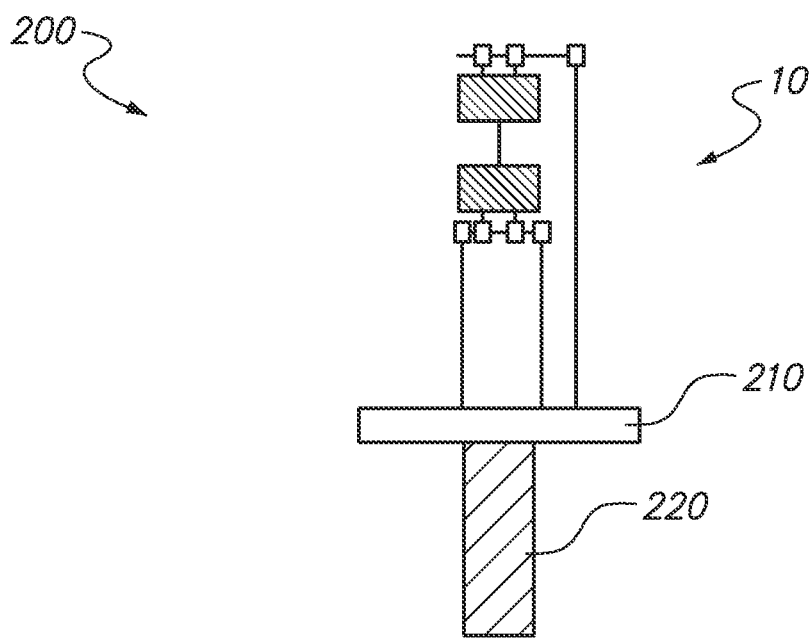
FIG. 3 shows a front view of a schematic diagram of an embodiment of a system on a platform employing a sample between two heat sources, in accordance with the System and Method for Producing a Sample Having a Monotonic Doping Gradient of a Diffusive Constituent or Interstitial Atom or Molecule.

FIG. 3 shows a front view of a schematic diagram 200 of an embodiment of a system on a platform in accordance with the System and Method for Producing a Sample Having a Monotonic Doping Gradient of a Diffusive Constituent or Interstitial Atom or Molecule. A system, such as system 10 shown in FIG. 1 or system 100 shown in FIG. 2, is positioned on a platform 210 which is supported by a base 220. Platform 210 and base 220 may comprise any commercially available material and may comprise various configurations as would be recognized by one having ordinary skill in the art, provided that system 10 can be adequately secured and supported. The system as shown may be inserted into an atmospheric chamber as shown in FIG. 4.

Figure 4:
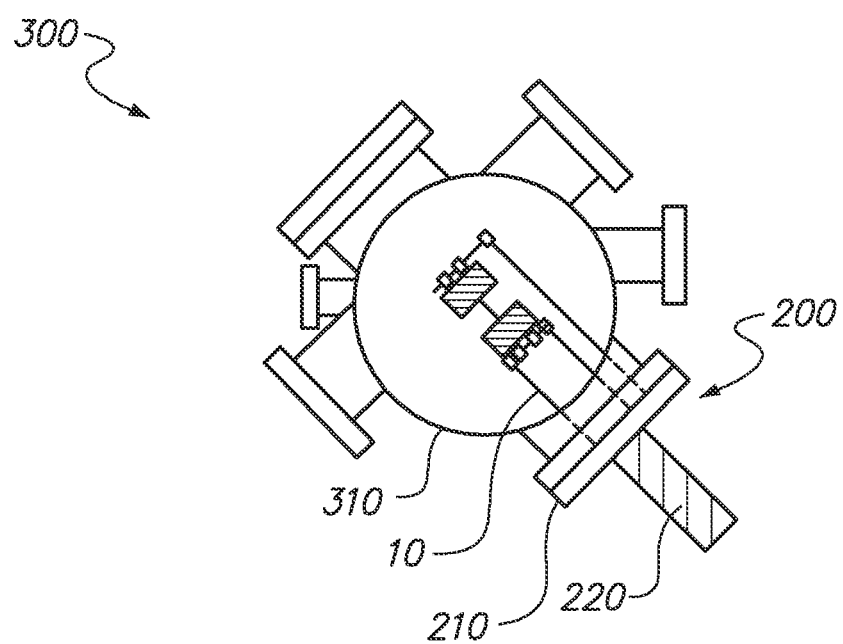
FIG. 4 shows a top view of a schematic diagram of an embodiment of a system positioned within an atmospheric chamber, in accordance with the System and Method for Producing a Sample Having a Monotonic Doping Gradient of a Diffusive Constituent or Interstitial Atom or Molecule.

Referring to FIG. 4, FIG. 4 shows a top view of a schematic diagram 300 of an embodiment of a system positioned within an atmospheric chamber. As an example, system 10 contained within system 200 is positioned within atmospheric chamber 310. Atmospheric chamber 310, an example of which is a vacuum chamber, may be pressure controlled and may be filled with a reactive or inert gas. The pressure that atmospheric chamber 310 is set to may depend on the composition of the sample material, the desired gradient for the sample material, the gas used in the atmospheric chamber, and the temperature of the heat source(s). For example, in the case of $YBa_2Cu_3O_x$, the sample is initially annealed in a 950 Torr oxygen atmosphere at 450° C. The sample is then placed in the thermal gradient apparatus with a heat source and heat sink. The oxygen atmosphere is set to a low pressure (e.g. 100 mTorr), the heat source is set to 450° C. and a thermal gradient equilibrium is established so that the heat sink is stable at 330° C. System 10 may be thermally well connected to atmospheric chamber 310 via a high vacuum flange connected to the heater block assembly. The flange may have electrical feed-throughs for connecting the controls of one or two heater blocks.

Figure 5:
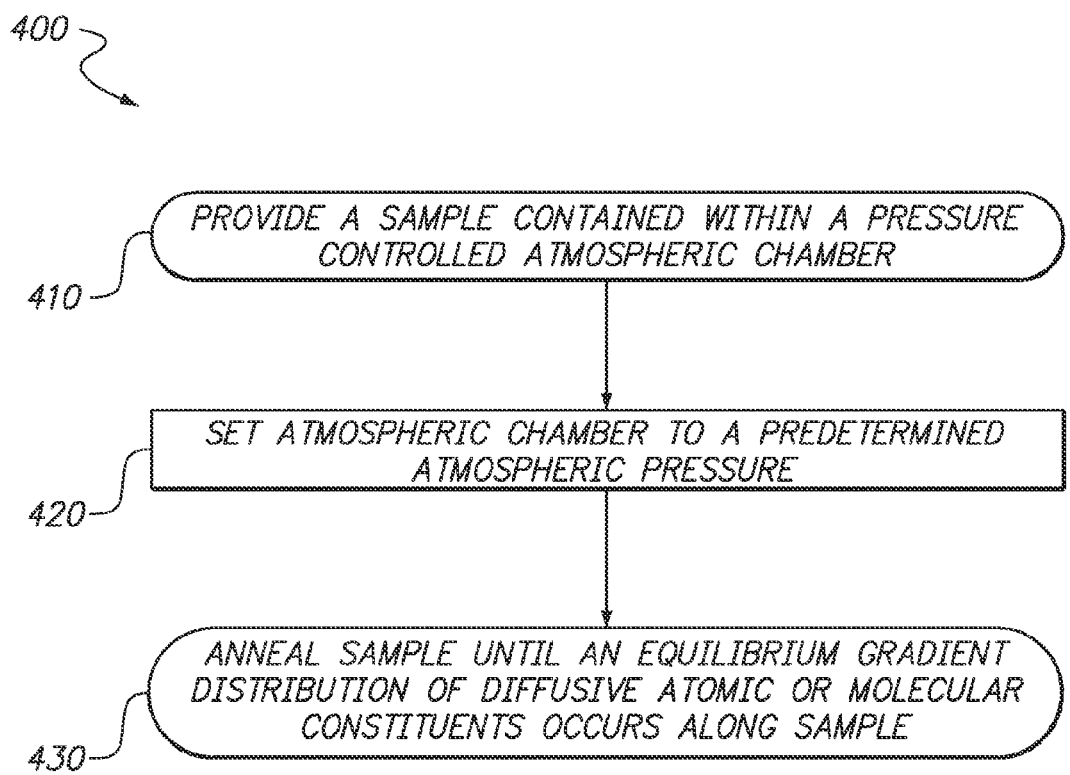
FIG. 5 shows a flowchart of an embodiment of a method in accordance with the System and Method for Producing a Sample Having a Monotonic Doping Gradient of a Diffusive Constituent or Interstitial Atom or Molecule.

FIG. 5 shows a flowchart of an embodiment of a method 400 in accordance with the System and Method for Producing a Sample Having a Monotonic Doping Gradient of a Diffusive Constituent or Interstitial Atom or Molecule. As an example, method 400 may be performed by a system as shown in FIG. 4, using systems 10 and 100 as shown in FIGS. 1 and 2 and described herein. Accordingly, method 400 will be discussed with reference to such systems and their respective components. Further, while FIG. 5 shows one embodiment of method 400 to include steps 410-430, other embodiments of method 400 may contain fewer or more steps. Further, while in some embodiments the steps of method 400 may be performed as shown in FIG. 5, in other embodiments the steps may be performed in a different order, or certain steps may occur simultaneously with one or more other steps.

Method 400 may begin at step 410, which involves providing a sample 20 contained within a pressure controlled atmospheric chamber 300. Step 420 may then involve setting atmospheric chamber 300 to a predetermined atmospheric pressure. The pressure of atmospheric chamber 300 is set to either a low or high atmospheric pressure depending on the content of at least one of diffusive atoms and diffusive molecules in the sample to be annealed. For example, if the sample has a low content of diffusive atoms or molecules, the atmospheric chamber will be set to a high pressure, and vice versa. In the case of $YBa_2Cu_3O_x$, low and high content are relative to x=6.0 and x=7.0 respectively, and a high pressure is considered greater than one standard atmosphere (760 Torr).

Step 430 may then involve annealing sample 20 until an equilibrium gradient distribution of the diffusive atomic or molecular constituents occurs along sample 20. For example, if the sample is flat and rectangular, the equilibrium gradient distribution would occur along both the length and width of sample 20 such that the distribution varies along the length but is uniform across any given cross section (width×thickness). In the case of a 1 cm×0.5 cm×200 nm $YBa_2Cu_3O_x$ film, an equilibrium oxygen gradient was found to be established after annealing under the conditions described above for at least 12 hours. The resulting oxygen distribution was established using focused x-ray diffraction measurements along the length of the film. These values were corroborated with resistivity measurements on resistance bridges lithographically formed on the same sample. The resulting distribution is shown in FIG. 6. The low temperature edge of the film exhibited no loss of oxygen while the high temperature edge lost ≈30% of the oxygen removable via annealing.

Referring to FIG. 6, FIG. 6 shows a graph 500 of the hole doping content per Cu site in the Cu—O plane vs. position along the sample length, p vs. x, of a $YBa_2Cu_3O_x$ film annealed using the system and method described herein. Of particular interest are the abrupt jumps of the hole concentration along the film length corresponding to well known concentration values associated with key physical phenomena at play in this class of materials, i.e., the pseudo-gap, the maximum in the superconducting transition temperature as a function of doping, and the suppression of the critical temperature in the region of ⅛ doping. The abrupt structural transitions observed (which are correlated with the hole concentration values) suggest that Josephson junctions bridging these structural/electronic transitions are realizable. Such junctions could be used as novel new ways to probe the physics of the competing electronic states in this material as well as be exploited in various electronic circuitries.

Many modifications and variations of the System and Method for Producing a Sample Having a Monotonic Doping Gradient of a Diffusive Constituent or Interstitial Atom or Molecule are possible in light of the above description. Within the scope of the appended claims, the embodiments of the systems described herein may be practiced otherwise than as specifically described. The scope of the claims is not limited to the implementations and the embodiments disclosed herein, but extends to other implementations and embodiments as may be contemplated by those having ordinary skill in the art.

I claim:

1. A method comprising the step of:
   annealing a sample of a chemical compound contained within a pressure controlled atmospheric chamber, wherein the sample comprises a parent material and one or more of at least one of diffusive atomic and molecular constituents, wherein one end of the sample is in physical contact with and held in place only by a heat source having a first temperature and the other end of the sample is in physical contact with and held in place only by a heat sink having a second temperature, wherein the second temperature is lower than the first temperature, until an equilibrium gradient distribution of the diffusive atomic or molecular constituents occurs along the sample such that the equilibrium gradient distribution varies along a length of the sample and is uniform across a given cross-section of the sample.

2. The method of claim 1, wherein the first temperature is a temperature above a characteristic thermal activation temperature of the sample at which at least some of the diffusive atomic or molecular constituents are able to diffusively move in and out of the parent material in a gaseous phase.

3. The method of claim 2, wherein the second temperature is a temperature below the characteristic thermal activation temperature of the sample at which at least some of the diffusive atomic or molecular constituents are able to diffusively move in and out of the parent material in a gaseous phase.

4. The method of claim 1, wherein the atmospheric chamber is set to a predetermined atmospheric pressure level prior to the step of annealing.

5. The method of claim 1, wherein the sample is a deposited film.

6. The method of claim 1, wherein the sample is a crystalline material.

7. The method of claim 1, wherein prior to the step of annealing, the sample has a uniform high content of at least one of diffusive atoms and diffusive molecules and the atmospheric chamber is set to a low atmospheric pressure.

8. The method of claim 1, wherein prior to the step of annealing, the sample has a uniform low content of at least one of diffusive atoms and diffusive molecules and the atmospheric chamber is set to a high atmospheric pressure.

9. A method comprising the steps of:
provided a sample comprising a crystalline material contained within a pressure controlled atmospheric chamber set to a predetermined atmospheric pressure, wherein the sample comprises a parent material and one or more of at least one of diffusive atomic and molecular constituents, wherein one end of the sample is in physical contact with and held in place only by a heat source having a first temperature and the other end of the sample is in physical contact with and held in place only by a heat sink having a second temperature, wherein the first temperature is a temperature above a characteristic thermal activation temperature of the sample at which at least some of the diffusive atomic and molecular constituents are able to diffusively move in and out of the parent material and the second temperature is a temperature below the characteristic thermal activation temperature of the sample at which at least some of the diffusive atomic and molecular constituents are able to diffusively move in and out of the parent material; and
annealing the sample until an equilibrium gradient distribution of the diffusive atomic or molecular constituents occurs along the sample such that the equilibrium gradient distribution varies along a length of the sample and is uniform across a given cross-section of the sample.

10. The method of claim 9, wherein the step of providing a sample contained within a pressure controlled atmospheric chamber set to a predetermined atmospheric pressure comprises providing a sample having a uniform high content of the diffusive atomic or molecular constituents contained within a pressure controlled atmospheric chamber set to a low atmospheric pressure.

11. The method of claim 9, wherein the step of providing a sample contained within a pressure controlled atmospheric chamber set to a predetermined atmospheric pressure comprises providing a sample having a uniform low content of the diffusive atomic or molecular constituents contained within a pressure controlled atmospheric chamber set to a high atmospheric pressure.

12. A system comprising:
a sample comprising a deposited film on a substrate contained within a pressure controlled atmospheric chamber, wherein the deposited film is a cuprate-based high-temperature superconductor, wherein one end of the sample is in physical contact with and held in place only by a heat source having a first temperature and the other end of the sample is in physical contact with and held in place only by a heat sink having a second temperature, wherein the second temperature is lower than the first temperature.

13. The system of claim 12 further comprising a structure configured to support the heat source and the heat sink such that the heat sink is positioned directly opposite to and separated from the heat source, wherein the heat source and heat sink are positioned in an atmospherically controllable vacuum chamber, the heat source temperature is controlled, and the sink temperature is kept at an equilibrium temperature below the activation temperature of the sample.

14. The system of claim 12, wherein the deposited film comprises $YBa_2Cu_3O_x$, where $6 \leq x \leq 7$.

15. The system of claim 12 further comprising a thermocouple coupled to the heat sink such that a thermocouple junction is in direct physical contact with a top edge of the sample.

* * * * *